United States Patent [19]
Park et al.

[11] Patent Number: 5,449,636
[45] Date of Patent: Sep. 12, 1995

[54] METHOD FOR THE FABRICATION OF DRAM CELL HAVING A TRENCH IN THE FIELD OXIDE

[75] Inventors: Sang H. Park; Chang S. Moon, both of Bubaleub, Rep. of Korea

[73] Assignee: Hyundai Electronics Industries Co., Ltd., Rep. of Korea

[21] Appl. No.: 281,301

[22] Filed: Jul. 27, 1994

[30] Foreign Application Priority Data

Jul. 27, 1993 [KR] Rep. of Korea ............... 1993-14369

[51] Int. Cl.6 .................. H01L 21/70; H01L 27/00
[52] U.S. Cl. .............................. 437/52; 437/60; 437/919
[58] Field of Search ............. 937/47, 52, 60, 919; 257/303, 306–308

[56] References Cited

U.S. PATENT DOCUMENTS 5,185,282  2/1993  Lee et al. ...................... 437/47
5,218,219  6/1993  Ajika et al. .................... 257/309

Primary Examiner—Olik Chaudhuri
Assistant Examiner—H. Jey Tsai
Attorney, Agent, or Firm—Merchant, Gould, Smith, Edell, Welter & Schmidt

[57] ABSTRACT

A method for the fabrication of DRAM cell is disclosed. The method is characterized by forming a trench in a field oxide in a transistor consisting of a field oxide, a gate insulating layer, a gate electrode capped with an insulating layer, a spacer insulating film and an impurity ion-implanted region connected with a capacitor. The trench formed in a field oxide effects an increase in a surface area of the charge storage electrode, resulting in an increased capacitance. Therefore, the method disclosed can overcome the limit of the conventional stacked capacitor which increases its surface area by heightening the charge storage electrode, maximizing charge storage capacitance. Consequently, the method can effect a high degree of integration in manufacturing a semiconductor device.

4 Claims, 6 Drawing Sheets

5,449,636

METHOD FOR THE FABRICATION OF DRAM CELL HAVING A TRENCH IN THE FIELD OXIDE

BACKGROUND OF THE INVENTION

1. Field of the invention

The present invention relates, in general, to the formation of capacitor in manufacturing a semiconductor device and, more particularly, to a method for the fabrication of DRAM cell, capable of increasing the capacitance.

2. Description of the Prior Art

It is indispensable to reduce the area of memory cell and to thus secure the charge storage capacitance in the cell for the high integration of dynamic random access memory (hereinafter referred to as "DRAM") device. In addition, a semiconductor device for very large scale integrated circuit, especially if the charge storage capacitance of capacitor is reduced, is likely to show frequent soft errors due to alpha particles.

Accordingly, intensive studies has been carried out on the development, an earnest subject in the art, for process for securing not only the charge storage capacitance but also device reliability.

In order to better understand the background of the present invention, there will be given description for a conventional DRAM cell with reference to FIG. 1.

On a silicon substrate 1, as shown in FIG. 1, a field oxide is initially formed, to define an active region, followed by the formation of a gate oxide 3 and a gate electrode 4. The gate electrode 4 is then insulated by an oxide layer 4' with a spacer oxide 5 being formed at a sidewall of the gate electrode and oxide layer. Thereafter, dopants are implanted into the silicon substrate, to form a transistor.

Subsequently, a nitride 8 is deposited entirely over the transistor and etched selectively to expose a source region, which is then connected with a first charge storage electrode 9. Over the resulting structure is entirely coated an oxide, so as to planarize its surface.

Next, the first charge storage electrode 9 is exposed and connected with a second charge storage electrode 11 which has a cross section of a vertical rod.

Finally, a dielectric film 13 and a plate electrode are formed in due order as shown in the figure, to complete the DRAM cell which may secure relatively much charge storage capacitance.

However, as semiconductor device is highly integrated, the height of the charge storage electrode vertically formed is restricted, so that the conventional method faces a difficulty, that is, further establishment of charge storage capacitance is difficult to obtain.

SUMMARY OF THE INVENTION

Therefore, an object of the present invention is to overcome the problems encountered in prior arts and to provide a method for the fabrication of DRAM cell, capable of securing a quantity of charge storage capacitance in a given memory cell, sufficient to effect a high degree of integration.

Based on the intensive and thorough study by the present inventors, the above object could be accomplished by a provision of a method for fabricating a DRAM cell which has a transistor consisting of a field oxide, a gate insulating layer, a gate electrode capped with an insulating layer, a spacer insulating film and an impurity ion-implanted region connected with a capacitor, comprising the steps of: forming a trench in a predetermined portion of the field oxide; depositing a first conductive layer entirely to come into connect with the ion-implanted region and etcing the first conductive layer so selectively as to leave no conductive layer in the trench, to form a pattern of a first charge storage electrode; coating an insulating layer entirely on the resulting structure and removing the insulating layer present in the areas wherein the capacitor is formed with the insulating layer left in the trench; forming a second conductive layer entirely over the resulting structure; planarizing the surface of the second conductive layer with a material and subjecting the material to etch back until the second conductive layer placed on the insulating layer is exposed and etching the exposed second conductive layer, to expose the insulating layer; and removing the material for planarization and the insulating layer and forming a dielectric film and a plate electrode, in due order.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE INVENTION

Figure 1:
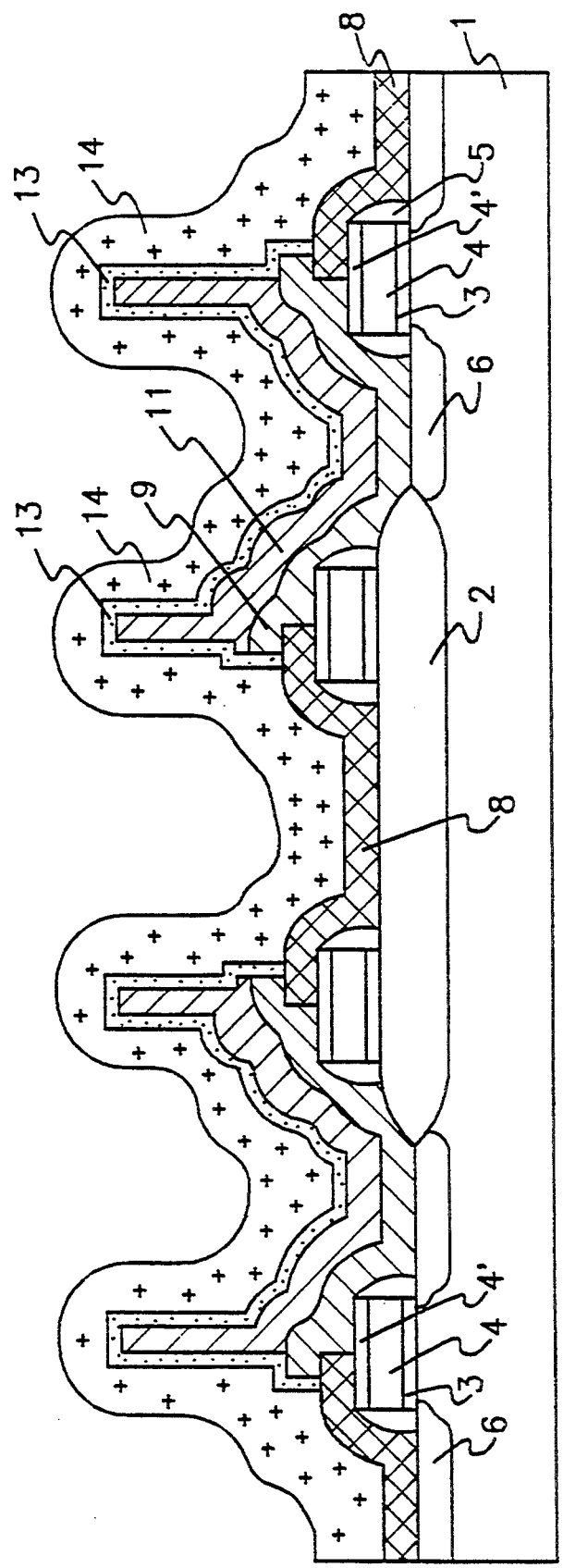
FIG. 1 is a schematic, cross-sectional view showing a DRAM cell according to a conventional method.

The application of the preferred embodiment of the present invention is best understood by referring to FIGS. 2A through 2E of the accompanying drawings, wherein like reference numerals are used for like and corresponding parts of the drawings, respectively.

Figure 2A:
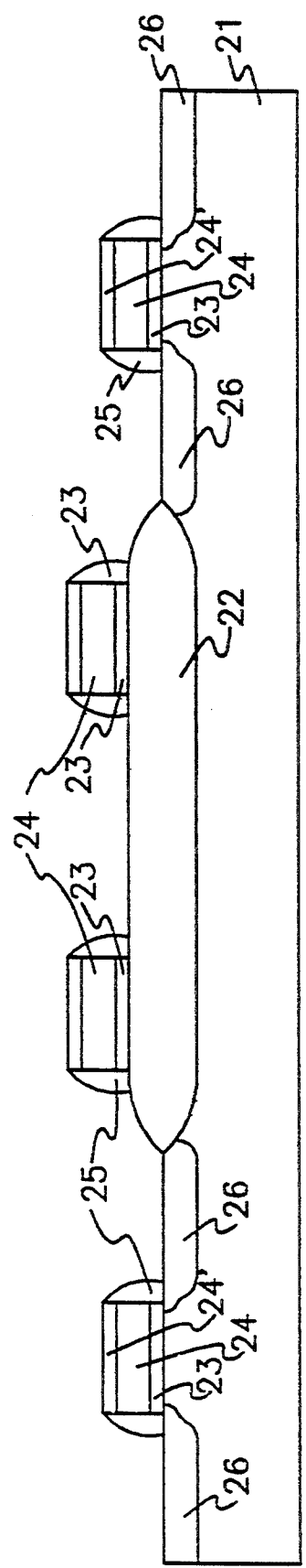
FIGS. 2A through 2E are schematic, cross-sectional views showing a fabrication method for DRAM cell according to the present invention.

Referring to FIG. 2A, a transistor is illustrated.

For the transistor, a silicon substrate 21 is initially subjected to oxidation process, for example, LOCOS, to form a field oxide 22. Gate oxides 23 are formed on predetermined portions, followed by the formation of gate electrode 24 on the gate oxide 23. The gate electrode is insulated by capping it with an insulating oxide layer 24' and forming a spacer oxide 25 at sidewall thereof. Thereafter, dopants are implanted into the silicon substrate 21, so as to form an ion-implanted region 26.

Figure 2B:
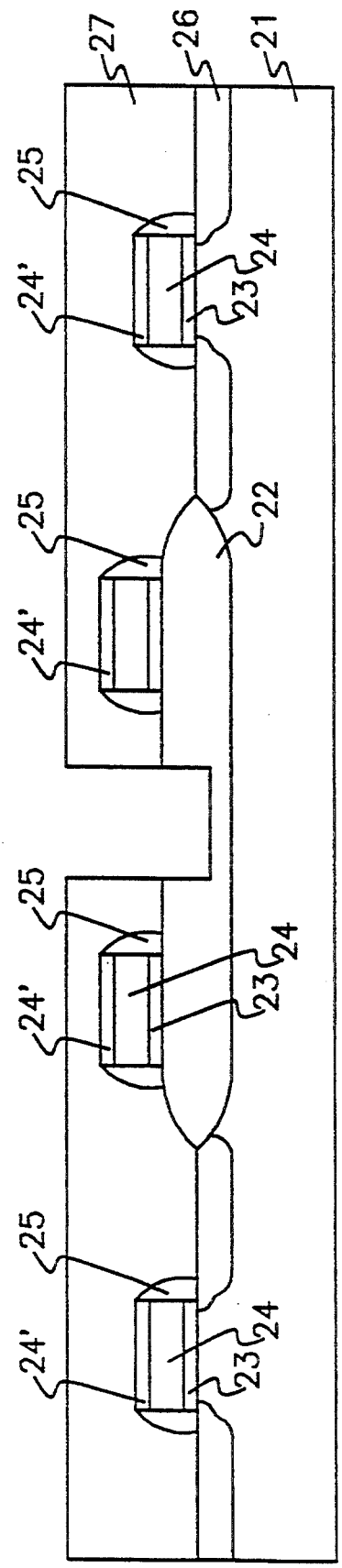

FIG. 2B shows a cross-section of the semiconductor device after a trench is formed in a predetermined portion of the field oxide 22. In advance of the formation of the trench, a first photosensitive layer is coated entirely over the transistor, as shown in this figure. The formation of trench in the field oxide is essential in the present invention.

The depth of the trench in the field oxide is more than half the thickness of the field oxide in order to secure more charge storage capacitance and to improve insulation between the devices.

Figure 2C:
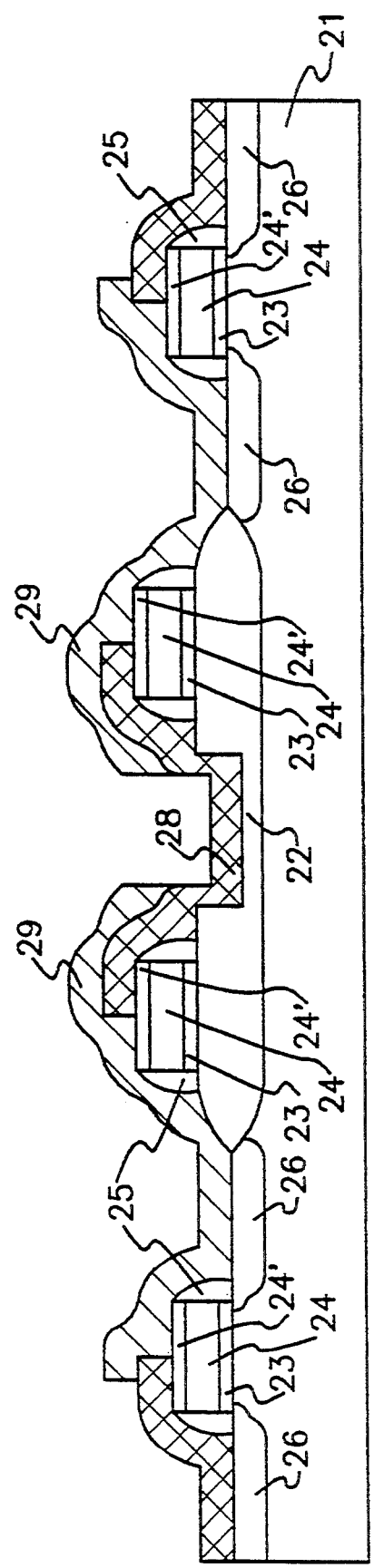

FIG. 2C shows a cross-section of the semiconductor device after the first photosensitive layer 27 is removed and a nitride 28 and a first charge storage electrode 29 are formed.

To improve the insulation effect of the field oxide 22, the nitride 28 is formed over the trench and further extended over a predetermined region of the gate electrode 24. After formation of the nitride, the first charge storage electrode 29 is formed by depositing doped polysilicon over the entire areas of the resulting structure but the trench.

Figure 2D:
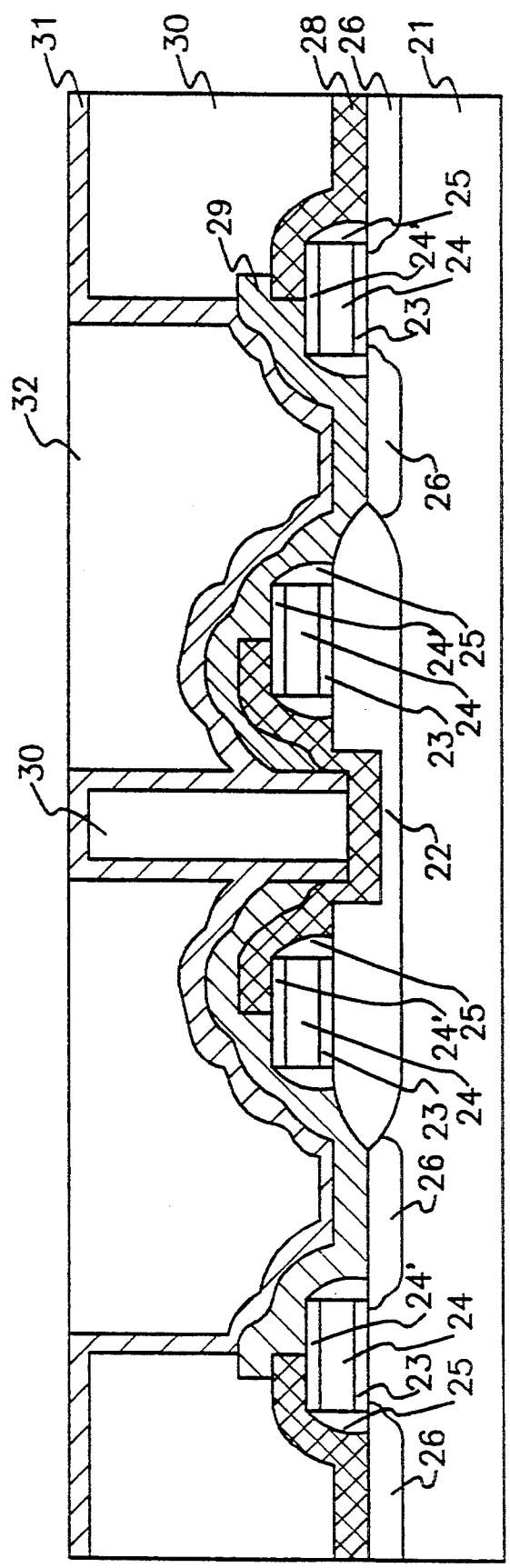

FIG. 2D shows a cross-section of the semiconductor device after an oxide 30 above the trench, polysilicon for a second charge storage electrode 31 and a second photosensitive layer 32 are formed.

The oxide 30 can be formed only above the trench by depositing an oxide layer entirely over the resulting structure of FIG. 2C with a chemical vapor deposition (CVD) process, planarizing its surface and etching it so selectively as to leave it only above the trench. Over the area wherein the oxide layer is etched off, a second charge storage electrode is to be formed.

After formation of the oxide 30, the polysilicon layer is formed over the resulting structure including the oxide 30. Over the polysilicon layer, there is coated the second photosensitive layer 32, which is then planarized and subjected to etch back until the polysilicon is exposed.

In this moment, using a spin-on-glass film instead of the photosensitive layer 32, the planarization can be carried out. Further, in accordance with the present invention, the insulating property can be improved by leaving a part of the oxide above the trench in lieu of removing it completely.

Figure 2E:
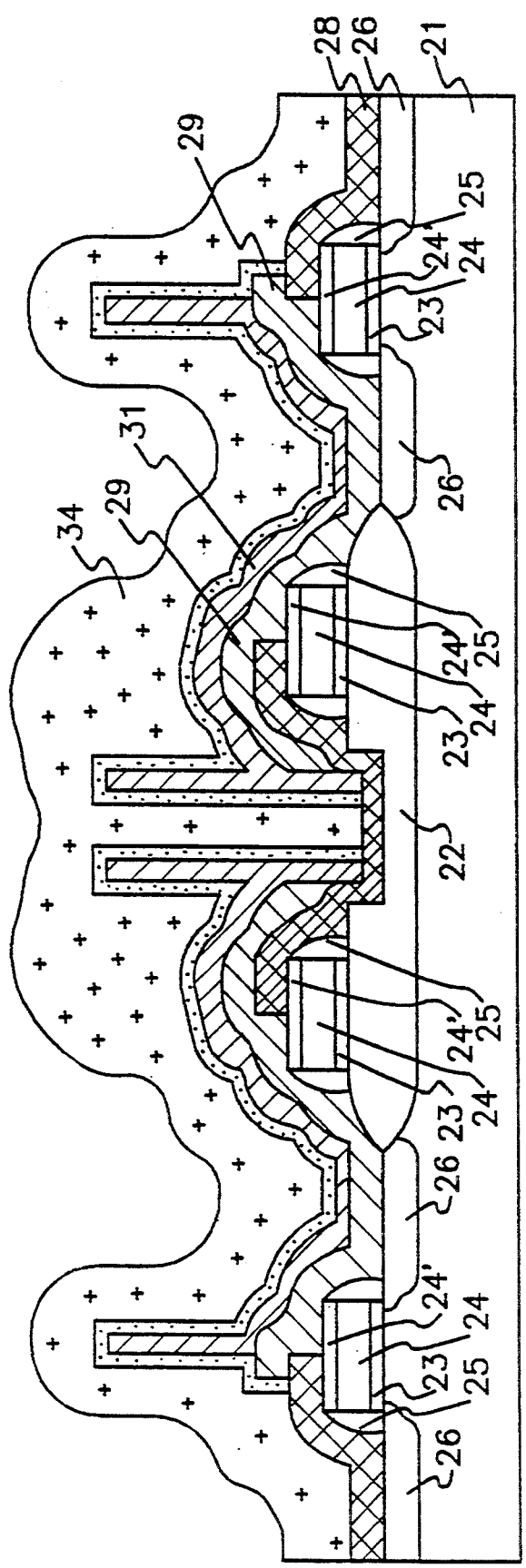

FIG. 2E shows a cross-section of the semiconductor device after a capacitor for a memory device is formed.

For this, an etching process is initially carried out to remove the polysilicon on the oxide 30 as well as the oxide 30. As a result, the polysilicon is separated into two charge storage electrodes which each belong to each of the two transistors, having a cross section of a rod vertically formed along the sidewall of the trench, as seen in this figure.

After formation of the second charge storage electrode, the second photosensitive layer 32 is removed. Over the exposed areas of the charge storage electrodes, the first and the second, a dielectric layer 33 is formed, followed by the formation of a plate electrode 34 over the resulting structure.

As described hereinbefore, a trench is formed in a field oxide, effecting an increase in surface area of the charge storage electrode, in accordance with the present invention. Therefore, the method provided by the present invention can overcome the limit of the conventional stacked capacitor which increases its surface area by heightening the charge storage electrode, maximizing charge storage capacitance. Consequently, the method of the present invention can effect a high degree of integration in manufacturing a semiconductor device.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a DRAM cell which has a transistor consisting of a field oxide, a gate insulating layer, a gate electrode capped with an insulating layer, a spacer insulating film and an impurity ion-implanted region connected with a capacitor, comprising the steps of:

forming a trench in a portion of said field oxide;

depositing a first conductive layer entirely to come into connect with said ion-implanted region and etching the first conductive layer so selectively as to leave no conductive layer in said trench, to form a pattern of a first charge storage electrode; then coating an insulating layer entirely on the resulting structure and removing the insulating layer present in areas wherein said capacitor is formed with the insulating layer left in said trench; then forming a second conductive layer over the resulting structure;

planarizing the surface of the second conductive layer with a material and subjecting the material to etch back until the second conductive layer placed on the insulating layer is exposed and etching the exposed second conductive layer, to expose the insulating layer; and removing the material for planarization and the insulating layer and sequentially forming a dielectric film and a plate electrode.

2. A method for fabricating a DRAM cell set forth as claim 1, wherein the step of forming a trench further comprises forming a nitride having a thickness on the trench in order to improve the insulation property of the device subsequent to the formation of the trench.

3. A method for fabricating a DRAM cell set forth as claim 1, wherein said material for planarization is selected from a group consisting of a photosensitive film and a spin-on-glass film.

4. A method for fabricating a DRAM cell set forth as claim 1, wherein said insulating layer remains on a part of said trench during the removal thereof, whereby insulating property between devices can be improved.

* * * * *